(12) United States Patent
Yan et al.

(10) Patent No.: US 8,465,221 B2
(45) Date of Patent: Jun. 18, 2013

(54) SERVER CABINET WITH GUIDING FIXTURES

(75) Inventors: Zhong-Yang Yan, Shenzhen (CN); Yi-Liang Hsiao, Taipei Hsien (TW); Wei Qiu, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 274 days.

(21) Appl. No.: 12/941,981

(22) Filed: Nov. 8, 2010

(65) Prior Publication Data
US 2011/0304247 A1    Dec. 15, 2011

(30) Foreign Application Priority Data
Jun. 15, 2010   (CN) .......................... 2010 1 0200776

(51) Int. Cl.
*B25G 3/00* (2006.01)
*A47B 96/06* (2006.01)

(52) U.S. Cl.
USPC ................ 403/348; 248/220.22; 248/222.52; 312/223.1; 403/350; 411/348

(58) Field of Classification Search
USPC ........ 248/27.1, 27.3, 220.22, 222.52, 222.11, 248/222.13, 222.14, 224.8, 225.11; 312/223.1, 312/334.4, 334.5; 403/348, 350; 361/756, 361/741, 802, 727; 411/349, 549, 553
See application file for complete search history.

(56) References Cited

U.S. PATENT DOCUMENTS

| | | | | | |
|---|---|---|---|---|---|
| 2,205,862 | A | * | 6/1940 | Rauch et al. | 411/549 |
| 2,205,863 | A | * | 6/1940 | Rauch et al. | 411/549 |
| 2,250,072 | A | * | 7/1941 | Tinnerman | 411/549 |
| 2,258,668 | A | * | 10/1941 | Zahodiakin | 411/554 |
| 2,283,526 | A | * | 5/1942 | Albin | 411/553 |
| 2,306,801 | A | * | 12/1942 | Churehill | 411/549 |
| 2,306,928 | A | * | 12/1942 | Bedford, Jr | 411/549 |
| 2,306,968 | A | * | 12/1942 | Mackie | 411/549 |
| 2,309,732 | A | * | 1/1943 | Johnson | 411/549 |
| 2,314,368 | A | * | 3/1943 | Poupitch | 411/549 |
| 2,327,330 | A | * | 8/1943 | Newbold | 411/549 |
| 2,327,331 | A | * | 8/1943 | Pender | 411/549 |
| 2,372,496 | A | * | 3/1945 | Huelster | 411/549 |
| 2,400,801 | A | * | 5/1946 | Albin | 411/549 |
| 2,401,184 | A | * | 5/1946 | Poupitch | 411/549 |
| 2,414,272 | A | * | 1/1947 | Poupitch | 411/549 |
| 2,491,451 | A | * | 12/1949 | Johnson | 411/549 |
| 2,498,591 | A | * | 2/1950 | Swanson | 411/549 |
| 2,552,066 | A | * | 5/1951 | Sorensen | 411/349 |
| 3,123,880 | A | * | 3/1964 | Barry et al. | 411/352 |

(Continued)

*Primary Examiner* — Kimberly Wood
(74) *Attorney, Agent, or Firm* — Altis Law Group, Inc.

(57) ABSTRACT

An exemplary server cabinet includes two brackets defining a space therebetween for receiving servers, and two guiding fixtures respectively engaged with the two brackets. Each bracket defines a latching hole. Each guiding fixture includes a supporting member and a latching member. The supporting member includes a main plate and a supporting arm extending from the main plate towards the space. The latching member includes a resisting plate attached to the main plate and a pivot extending from the resisting plate. A plurality of protrusions extends outwards from an end of the pivot. The latching member is rotated to engage the protrusions with the corresponding bracket at a periphery of the latching hole after the end of the pivot extends through the supporting member and the latching hole of the bracket such that the main plate is sandwiched between the resisting plate and the bracket and attached to the bracket.

17 Claims, 7 Drawing Sheets

U.S. PATENT DOCUMENTS

| | | | |
|---|---|---|---|
| 3,407,454 A * | 10/1968 | Myatt | 411/549 |
| 3,744,101 A * | 7/1973 | Gley | 24/453 |
| 6,728,109 B1 * | 4/2004 | Wu | 361/747 |
| 6,771,496 B1 * | 8/2004 | Wu | 361/679.58 |
| 7,222,925 B2 * | 5/2007 | Yu et al. | 312/245 |
| 7,408,767 B2 * | 8/2008 | Han | 361/679.32 |
| 7,543,786 B2 * | 6/2009 | Yang | 248/222.51 |
| 7,576,974 B2 * | 8/2009 | Liu et al. | 361/679.07 |
| 7,913,957 B2 * | 3/2011 | Nelson et al. | 248/71 |
| 7,984,883 B2 * | 7/2011 | Li et al. | 248/125.7 |
| 8,248,811 B2 * | 8/2012 | Peng et al. | 361/756 |
| 8,289,691 B2 * | 10/2012 | Peng et al. | 361/679.33 |
| 2005/0078445 A1 * | 4/2005 | Chen et al. | 361/685 |

* cited by examiner

SERVER CABINET WITH GUIDING FIXTURES

BACKGROUND

1. Technical Field

The present disclosure relates to server cabinets, and particularly to a server cabinet having guiding fixtures for facilitating installation of servers therein.

2. Description of Related Art

Computer server systems often include multiple standard servers mounted in a standard server cabinet. Typically, a pair of brackets is provided in the server cabinet for supporting the servers thereon, and a plurality of fixing components matching the brackets are provided to fix the servers onto the brackets. However, the fixing components are individual pieces, which make it laborious to install the servers into the server cabinet. Further, after the servers are removed, the fixing components are easily lost or misplaced.

What is needed, therefore, is a means which can overcome the limitations described.

DETAILED DESCRIPTION

Figure 1:
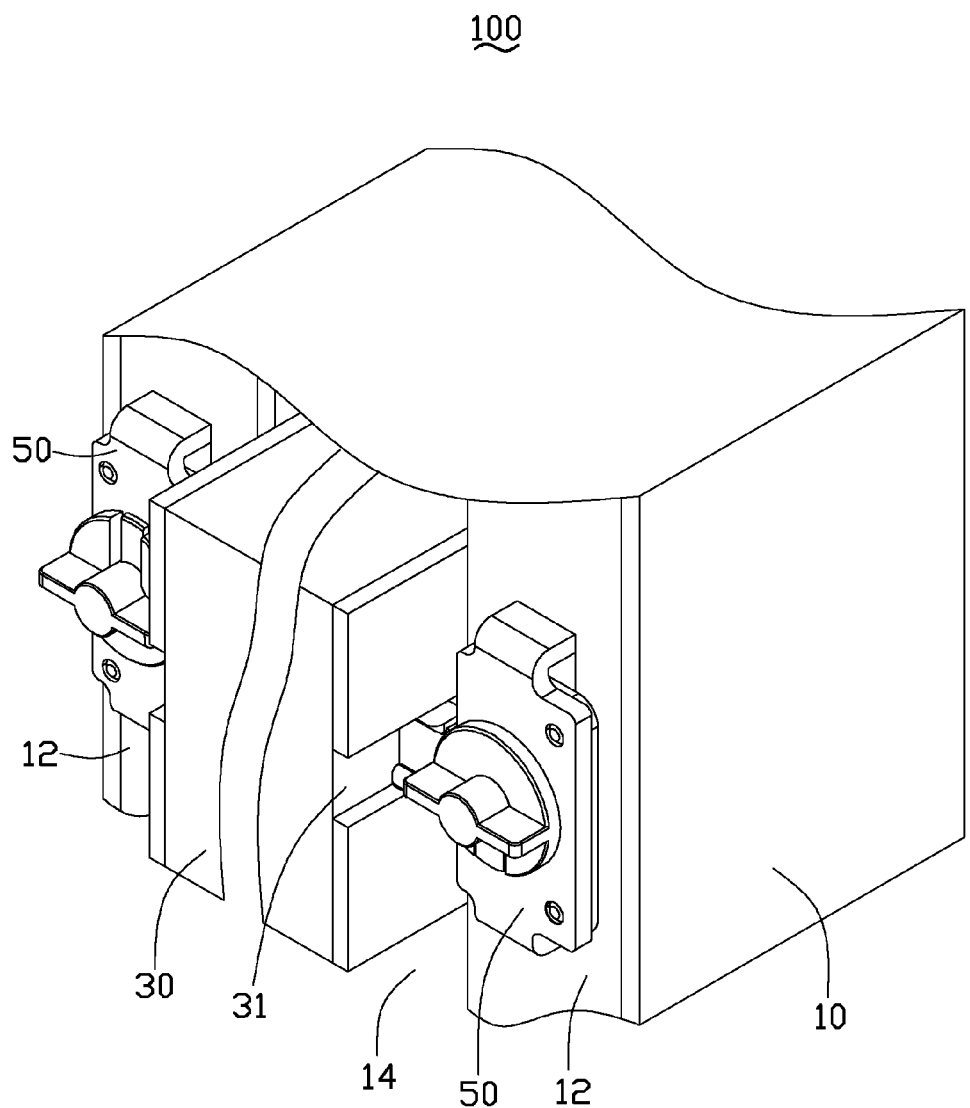
FIG. 1 is an isometric, assembled view of part of a server cabinet according to an exemplary embodiment of the disclosure, showing two guiding fixtures and one corresponding server (shown abbreviated) slidably supported on the guiding fixtures.

Referring to FIG. 1, part of a server cabinet 100 in accordance with an exemplary embodiment of the disclosure is shown. The server cabinet 100 is used for accommodating a plurality of servers 30 therein. For simplicity, in this embodiment, only one server 30 is shown.

The server cabinet 100 includes a hollow casing 10, a pair of brackets 12 fixed in a front of the casing 10, and a plurality of pair of guiding fixtures 50 fixed on the brackets 12. The servers 30 are supported in the casing 10 by the guiding fixtures 50. For enhancing stability of the servers 30, there can be another pair of brackets 12 fixed in a rear of the casing 10, and two pairs of the guiding fixtures 50 for each server 30. One pair of the guiding fixtures 50 supports a rear end of the server 30, and the other pair of the guiding fixtures 50 supports a front end of the server 30. In the following description, unless the context indicates otherwise, only the pair of brackets 12 at the front of the casing 10 and the corresponding pair of guiding fixtures 50 will be discussed.

Figure 6:
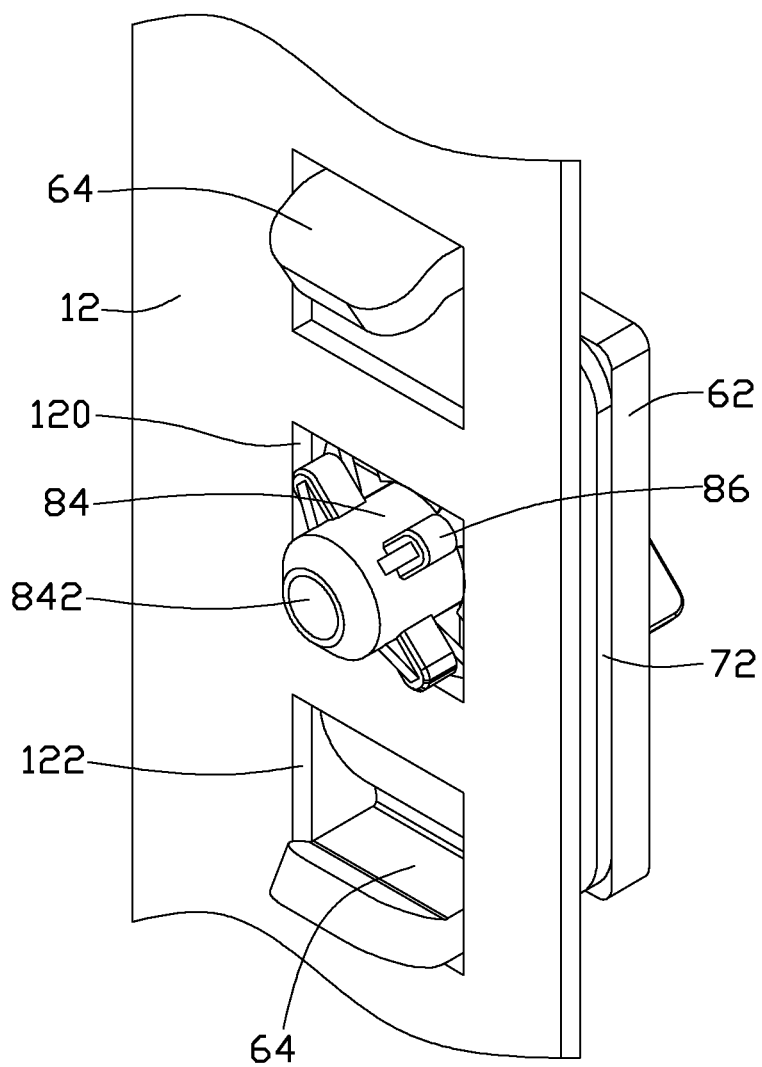
FIG. 6 is similar to FIG. 5, but shows the guiding fixture coupled to a bracket of the server cabinet.

The two brackets 12 are spaced from each other. A space 14 is defined between the brackets 12 for receiving the servers 30 therein. In this embodiment, each of the brackets 12 is an elongated vertical plate. A distance between the brackets 12, that is, a width of the space 14, is substantially equal to a width of each server 30. Referring also to FIG. 6, a plurality of latching holes 120 is defined in each of the brackets 12. The latching holes 120 are evenly distributed along a vertical axis of the bracket 12, with a distance between each two neighboring latching holes 120 slightly exceeding a height of each server 30.

Figure 7:
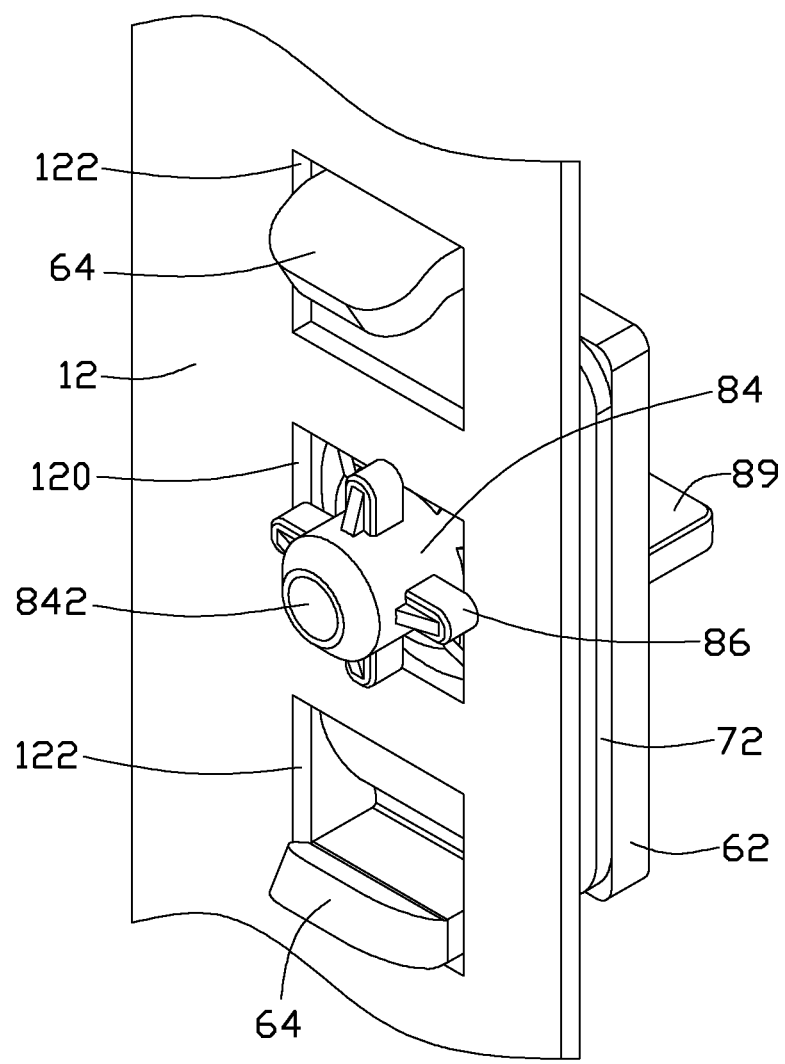
FIG. 7 is similar to FIG. 6, but shows the guiding fixture locked on the bracket.

The plurality of pairs of guiding fixtures 50 are connected to the two brackets 12. When the server cabinet 100 is filled to capacity with servers 30, the number of pairs of guiding fixtures 50 equals the number of pairs of latching holes 120 of the brackets 12. Each guiding fixture 50 is received in one of the latching holes 120. Referring also to FIG. 7, for facilitating assembly of the guiding fixtures 50 to the brackets 12, two positioning holes 122 are defined in each bracket 12 at top and bottom sides of each latching hole 120, respectively. The latching holes 120 and the positioning holes 122 are generally rectangular. In the illustrated embodiment, the latching holes 120 are square.

After assembly, the guiding fixtures 50 of each pair are respectively fixed on the two brackets 12 and are substantially at the same level, for mounting one server 30 thereon. In FIG. 1, only one pair of guiding fixtures 50 is shown with one server 30 supported thereon. It should be understood that other servers 30 can be mounted to the server cabinet 100 by corresponding pairs of guiding fixtures 50 in the same way.

Figure 2:
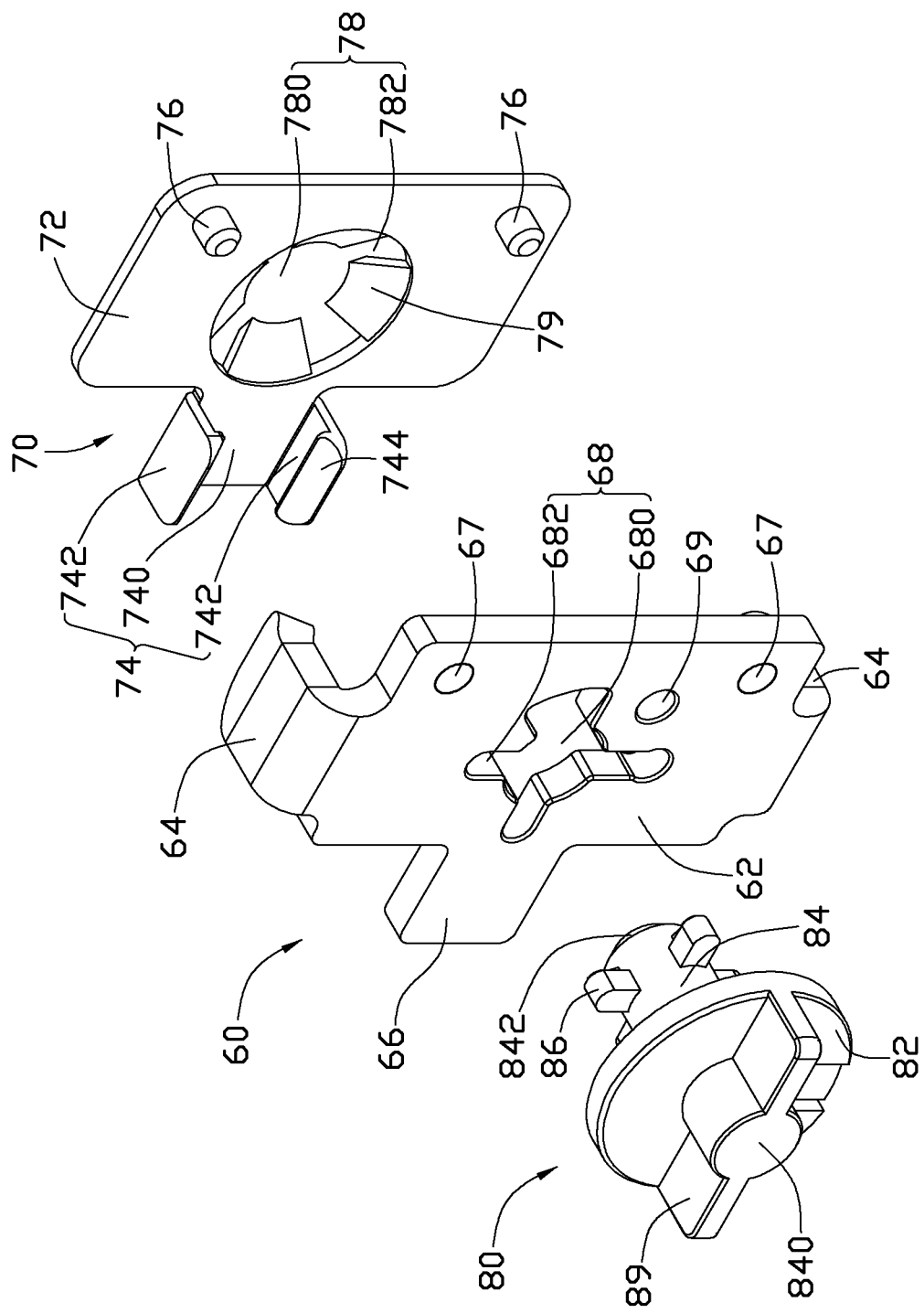
FIG. 2 is an isometric, exploded view of one of the guiding fixtures of the server cabinet of FIG. 1.
Figure 3:
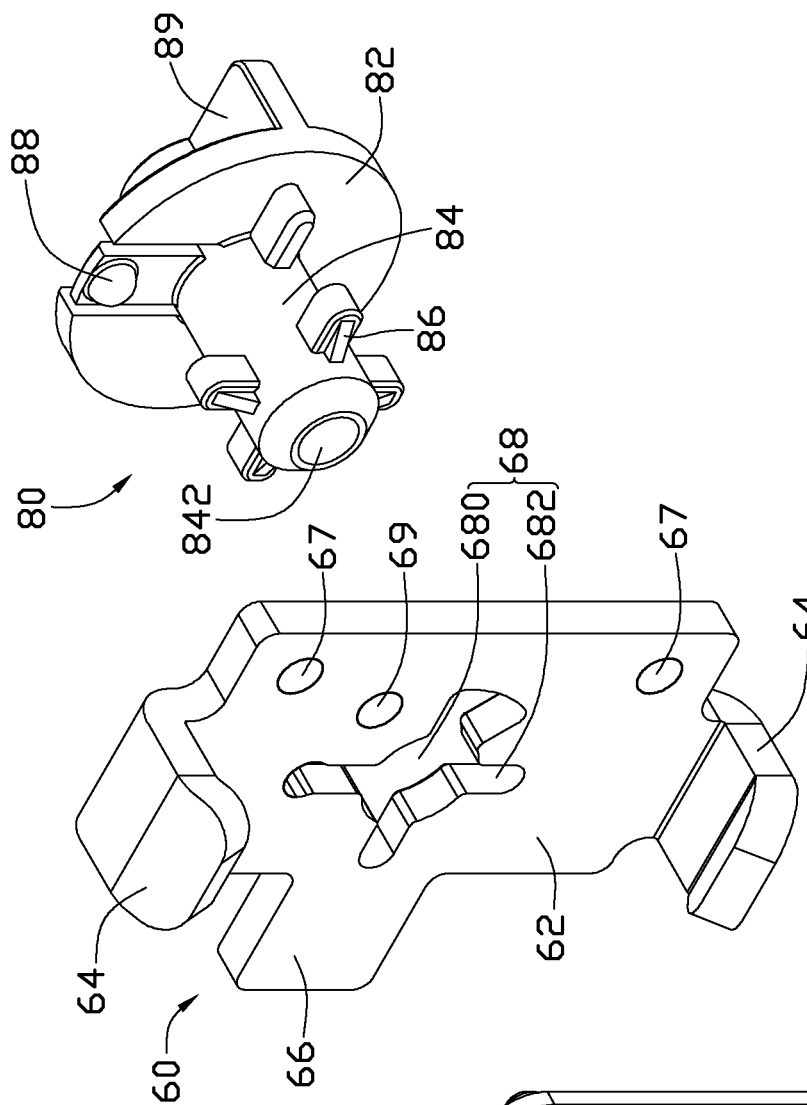
FIG. 3 shows the guiding fixture of FIG. 2 viewed from another aspect.

Referring also to FIGS. 2 and 3, each of the guiding fixtures 50 includes a supporting member 60, a resilient member 70, and a latching member 80. The supporting member 60 and the resilient member 70 can be detachably assembled together by the latching member 80. That is, the guiding fixture 50 can be assembled to become a single unitary piece.

The supporting member 60 is made of high strength (intensity) material, such as iron. The supporting member 60 includes a main plate 62, two positioning arms 64, and a supporting arm 66.

The main plate 62 of the supporting member 60 is rectangular, and has a height substantially the same as a distance between the two positioning holes 122 at the opposite sides of the corresponding latching hole 120.

The positioning arms 64 of the supporting member 60 bend along essentially the same direction from top and bottom edges of the main plate 62, respectively, and are generally perpendicular to the main plate 62. The positioning arms 64 are adapted for being received in the positioning holes 122 of the bracket 12, to preassemble the guiding fixture 50 onto the bracket 12.

The supporting arm 66 of the supporting member 60 extends outwards from a middle of a lateral side of the main plate 62. In FIGS. 2 and 3, the supporting arm 66 extends from the left side of the main plate 62. The supporting arm 66 is rectangular, and is coplanar with the main plate 62.

An opening 68 is defined in a central portion of the main plate 62, corresponding to the latching hole 120 of the bracket 12. The opening 68 and the supporting arm 66 are substantially at the same level. In this embodiment, the opening 68 includes a circular hole 680 and four slots 682 extending radially outwardly therefrom. The slots 682 are evenly spaced along a circumference of the circular hole 680. Two of the slots 682 extend vertically, and the other two slots 682 extend horizontally.

Two through holes 67 are defined in the main plate 62 at two corners thereof, respectively. In this embodiment, the through holes 67 are located at the right side of the main plate 62. A limiting hole 69 is defined in a bottom-right portion of the main plate 62, as viewed in FIG. 2. The limiting hole 69 is located between two neighboring slots 682.

The resilient member 70 is adapted for buffering impact on the supporting member 60. In other embodiments, the resilient member 17 can be omitted. In this embodiment, the resilient member 70 is made of plastic, and includes a main body 72 and a supporting body 74 extending from the main body 74.

The main body 72 of the resilient member 70 has a shape and a size generally the same as the main plate 62 of the supporting member 60. Two posts 76 extend from the main body 72 towards the main plate 62 of the supporting member 60, corresponding to the through holes 67 of the main plate 62. An aperture 78 is defined in a central portion of the main body 72, corresponding to the opening 68 of the main plate 62 of the supporting member 60.

Four elastic fins 79 obliquely extend from the main body 72 at a periphery of the aperture 78. The elastic fins 79 are evenly spaced from each other along a circumference of the aperture 78. The elastic fins 79 extend generally radially inward, but also in directions obliquely away from the supporting member 60. A slit 782 is defined between each two neighboring elastic fins 79. The slits 782 and the slots 682 alternate along the circumference of the aperture 78 when the supporting member 60 and the resilient member 70 are assembled together. Outer ends of the elastic fins 79 protrude out of the main body 72. A central hole 780 is defined between the outer ends of the elastic fins 79, with a diameter of the central hole 780 substantially the same as that of the circular hole 680 of the supporting member 60. Thus, the central hole 780 and the slits 782 cooperatively form the aperture 78.

The supporting body 74 of the resilient member 70 includes a first plate 740 extending outwards from a middle of a left side of the main body 72, and two second plates 742 bending from top and bottom sides of the first plate 740, respectively. The first plate 740 is generally the same as the supporting arm 66 in shape and size, and is positioned relative to the main body 72 in a way corresponding to the way that the supporting arm 66 is positioned relative to the main plate 62. The second plates 742 are perpendicular to the first plate 740, and are adapted for increasing contact areas between the guiding fixtures 50 and the corresponding server 30. A hook 744 is formed at an outer edge of each second plate 742, with the two hooks 744 of the second plates 742 facing each other.

The latching member 80 includes a resisting plate 82, and a pivot 84 intersecting the resisting plate 82. The resisting plate 82 is circular and the pivot 84 is columnar. The pivot 84 has an outer end 840 and an inner end 842. A diameter of the pivot 84 is less than that of the resisting plate 82, but generally equal to that of the circular hole 680 and the central hole 780. A bulge 88 protrudes from a side of the resisting plate 82 that faces the inner end 842 of the pivot 84. An operating portion 89 is formed at the outer end 840 of the pivot 84, for facilitating manual operation of the latching member 80.

A plurality of protrusions 86 is formed at the inner end 842 of the pivot 84. The protrusions 86 lie in a same imaginary plane, which is perpendicular to the pivot 84; and the protrusions 86 are evenly distributed along a circumference of the pivot 84. In this embodiment, there are four protrusions 86. One of the protrusions 86 aligns with the bulge 88. An imaginary circle on which outer ends of the protrusions 86 are located has a diameter not exceeding a length of a diagonal of the latching hole 120 of the bracket 12, but exceeding both a width and a height of the latching hole 120.

Figure 4:
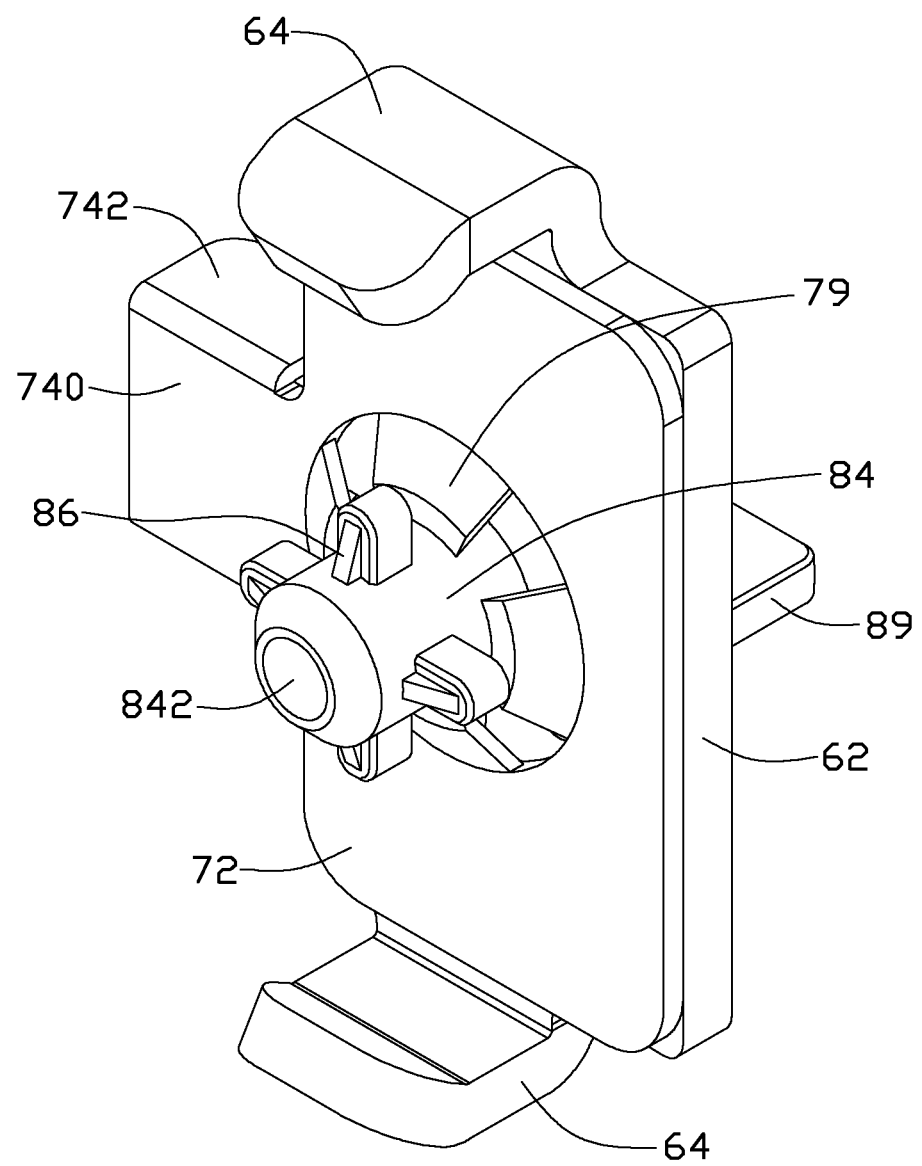
FIG. 4 is an assembled view of the guiding fixture of FIG. 3, showing the guiding fixture self-locked.

Referring also to FIG. 4, during assembly of the guiding fixture 50 illustrated therein, the resilient member 70 is coupled to the supporting member 60, with the main body 72 of the resilient member 70 overlapping the main plate 62 of the supporting member 60. The posts 76 of the resilient member 70 extend through the through holes 67 of the main plate 62 of the supporting member 60, respectively, to position the resilient member 70 on the supporting member 60.

The first plate 740 of the supporting body 74 of the resilient member 70 overlaps a rear face of the supporting arm 66 of the supporting member 60. The second plates 742 of the supporting body 74 are at top and bottom sides of the supporting arm 66. The hooks 744 of the second plates 742 engage with a top and a bottom of a front face of the supporting arm 66, and keep the resilient member 70 in position. In such a state, the circular hole 680 of the supporting member 60 aligns with the central hole 780 of the resilient member 70, and the slots 682 of the supporting member 60 align with the elastic fins 79 of the resilient member 70, respectively.

During assembly of the latching member 80 to the combined supporting member 60 and resilient member 70, the protrusions 86 on the inner end 842 of the pivot 84 respectively align with the slots 682 of the supporting member 60, and the bulge 88 of the resisting plate 82 aligns with one of the slots 682 adjacent to the limiting hole 69. The resisting plate 82 is pushed towards the supporting member 60 to extend the inner end 842 of the pivot 84 through the opening 68 of the supporting member 60. When the protrusions 86 on the inner end 842 of the pivot 84 encounter the elastic fins 79 of the resilient member 70, the elastic fins 79 deform to admit extension of the protrusions 86 under the rearward force of the latching member 80. The protrusions 86 engage with rear faces of the elastic fins 79 after the inner end 842 of the pivot 84 has completely passed through the resilient member 70. Thereby, the guiding fixture 50 is assembled.

Figure 5:
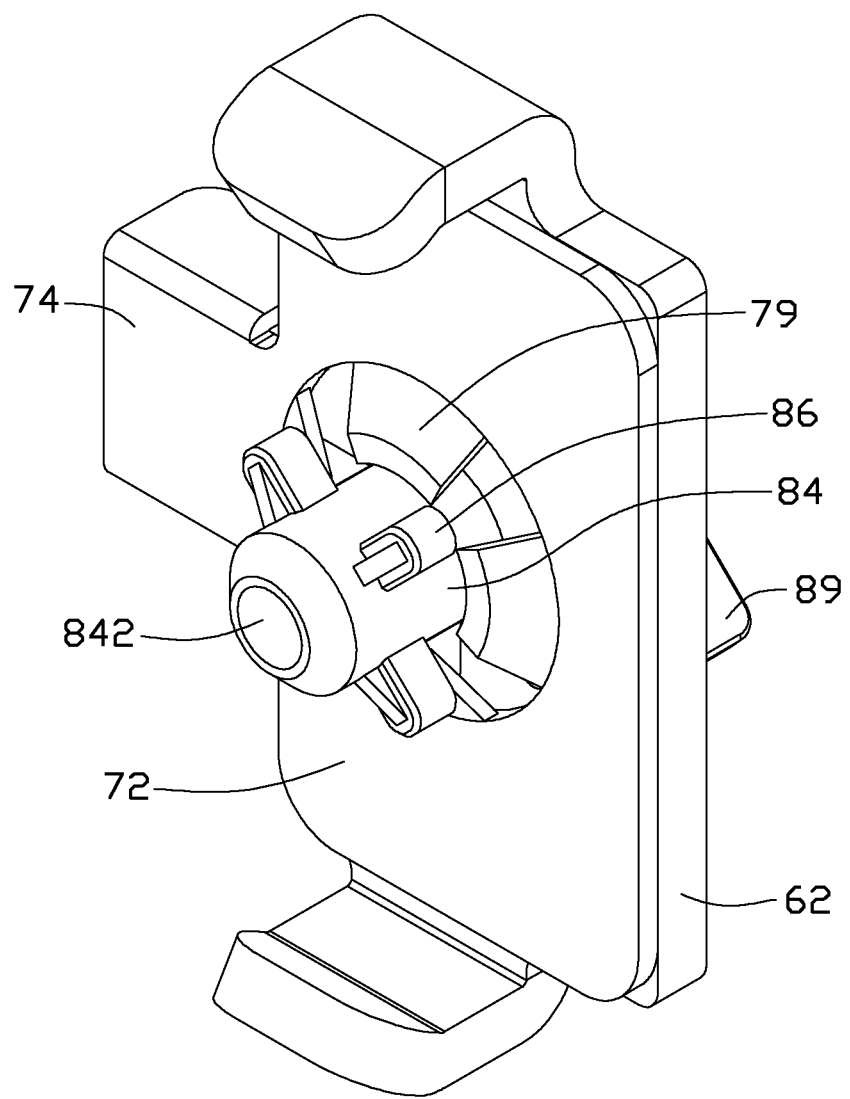
FIG. 5 is similar to FIG. 4, but shows the guiding fixture unlocked.

Referring also to FIGS. 5 and 6, during assembly of the guiding fixture 50 illustrated therein to the bracket 12, the supporting arm 66 of the guiding fixture 50 is oriented towards the space 14 between the brackets 12, and the inner end 842 of the pivot 84 is oriented towards the latching hole 120 of the bracket 12. The latching member 80 is rotated counterclockwise about 45° (as viewed in FIGS. 1-2) to align the protrusions 86 of the pivot 84 with the diagonals of the latching hole 120. In such a state, the bulge 88 of the pivot 84 is received in the limiting hole 69 of the supporting member 60, thereby avoiding relative rotation of the latching member 80 and the supporting member 60.

The guiding fixture 50 is pushed onto the bracket 12, with the inner end 842 of the pivot 84 of the latching member 80 extending through the latching hole 120, and the positioning arms 64 of the supporting member 60 being received in the positioning holes 122 of the bracket 12, respectively. Thereby, the guiding fixture 50 is preassembled on the bracket 12, as shown in FIG. 6.

Referring also to FIG. 7, the latching member 80 is then rotated again to align the protrusions 86 of the pivot 84 horizontally and vertically. In the present embodiment, the rotation of the latching member 80 is about 45° clockwise (as viewed in FIGS. 1-2). Since the width and height of the latching hole 120 are both less than the diameter of the circle defined by the outer ends of the protrusions 86, the outer ends of the protrusions 86 engage a rear face of the bracket 12 at a periphery of the latching hole 120. Thus the inner end 842 of the pivot 84 is prevented from escaping from the bracket 12, and the guiding fixture 50 is latched on the bracket 12.

Referring to FIG. 1 again, during assembly of the server 30 into the server cabinet 100, the supporting arms 66 of each pair of guiding fixtures 50 on the two brackets 12 extend into the space 14, and thus the server 30 can slide into the space 14 along the supporting arms 66. In this embodiment, two sliding grooves 31 are defined in opposite lateral sides of the server 30. The supporting arms 66 are slidably received in the sliding grooves 31 of the server 30. Alternatively, the server 30 can be directly rested on the top sides of the supporting arms 66, and slid along the supporting arms 66 into the space 14. This alternative arrangement is useful in a case where the server 30 does not have the sliding grooves 31. Since each guiding fixture 50 can be assembled to become a single unitary piece, assembly of the server 30 into the server cabinet 100 is convenient, and the guiding fixtures 50 are easy to maintain and keep track of.

It is to be understood, however, that even though numerous characteristics and advantages of certain embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A server cabinet for accommodating servers therein, the server cabinet comprising:
   two brackets defining a space therebetween for receiving the servers, each of the brackets defining a latching hole therein; and
   two guiding fixtures respectively engaged with the two brackets, each of the guiding fixtures comprising a supporting member, a latching member and a resilient member, the supporting member comprising a main plate and a supporting arm extending from the main plate towards the space, the supporting member defining an opening therein, the latching member comprising a resisting plate attached to the main plate of the supporting member and a pivot extending from the resisting plate, a plurality of protrusions extending outwards from an end of the pivot, the latching member rotated to engage the protrusions with the corresponding bracket at a periphery of the latching hole after the end of the pivot extends through the supporting member and the latching hole of the corresponding bracket such that the main plate is sandwiched between the resisting plate and the bracket and attached to the bracket, the resilient member comprising a main body sandwiched between the main plate of the supporting member and the bracket and a supporting body extending from the main body towards the space, an aperture being defined in the main body of the resilient member corresponding to the opening.

2. The server cabinet of claim 1, wherein the latching hole is rectangular, and outer ends of the protrusions define a circle having a diameter not exceeding a length of a diagonal of the latching hole of the bracket, but exceeding both a width and a height of the latching hole.

3. The server cabinet of claim 1, wherein the opening comprises a circular hole receiving the end of the pivot and a plurality of slots extending outwards from the circular hole, the protrusions of the pivot extending through the supporting member via the slots.

4. The server cabinet of claim 1, wherein a plurality of elastic fins extend from a periphery of the aperture, a slit is defined between each two neighboring elastic fins, and a central hole is defined between outer ends of the elastic fins, the central hole corresponding to the circular hole of the opening, the elastic fins and the slots alternating.

5. The server cabinet of claim 4, wherein the elastic slits extend from the main body of the resilient member in directions obliquely away from the supporting member.

6. The server cabinet of claim 1, wherein a through hole is defined in one of the main plate and the main body, and a post extends from the other of the main plate and the main body to be received in the through hole.

7. The server cabinet of claim 1, wherein the supporting body comprises a first plate overlapping the supporting arm, and two second plates bending from opposite sides of the first plate, the second plates sandwiching the supporting arm to buffer impact on the supporting member.

8. The server cabinet of claim 7, wherein the supporting member is iron, and the resilient member is plastic.

9. The server cabinet of claim 1, wherein a bulge protrudes from the resisting plate of the latching member towards the supporting member, aligned with one of the protrusions, and a limiting hole is defined in the main plate of the supporting member, and the bulge received in the limiting hole during extension of the protrusions through the latching hole, while the bulge escapes the limiting hole when the protrusions engage the bracket at the periphery of the latching hole.

10. The server cabinet of claim 1, wherein the supporting member further comprises positioning arms bent from top and bottom sides of the main plate, respectively, and the bracket defines positioning holes at top and bottom sides of the latching hole, respectively, the positioning arms received in the positioning holes, respectively.

11. A server cabinet, comprising:
    two brackets spaced from each other, each of the brackets defining a plurality of latching holes therein; and
    a plurality of pairs of guiding fixtures coupled to the two brackets, the guiding fixtures of each pair being substantially at the same level and respectively engaged in two of the latching holes of the brackets, each of the guiding fixtures comprising:
    a supporting member comprising a main plate defining an opening corresponding to the latching hole of one corresponding bracket and a supporting arm extending from the main plate towards the space;
    a latching member comprising a resisting plate and a pivot extending from the resisting plate through the opening of the main plate and the latching hole of the corresponding bracket, a plurality of protrusions extending outwards from an end of the pivot, the protrusions engagable with the corresponding bracket at a periphery of the latching hole by rotating the latching member after the pivot has extended through the latching hole of the corresponding bracket; and
    a resilient member, the resilient member and the resisting plate being located at opposite sides of the main plate, the resilient member comprising a main body and a supporting body extending from the main body towards the space, and an aperture being defined in the main body corresponding to the opening.

12. The server cabinet of claim 11, wherein the latching hole is rectangular, and outer ends of the protrusions define a circle having a diameter not exceeding a diagonal of the latching hole, and exceeding both a width and a length of the latching hole.

13. The server cabinet of claim 11, wherein a plurality of elastic fins extend from a periphery of the aperture in directions obliquely away from the resilient member, a slit is defined between each two neighboring elastic fins, and a central hole is defined between outer ends of the elastic fins, the central hole corresponding to the end of the pivot, and the elastic fins corresponding to the protrusions of the pivot.

14. The server cabinet of claim 13, wherein the opening comprises a circular hole corresponding to the central hole and a plurality of slots extending outwards from the circular hole, and the slots and the slits are alternating.

15. The server cabinet of claim 11, wherein the supporting member is iron, and the resilient member is plastic.

16. The server cabinet of claim 11, wherein a bulge protrudes from the resisting plate of the latching member towards the supporting member, aligned with one of the protrusions, a limiting hole is defined in the main plate of the supporting member, and the bulge is received in the limiting hole during extension of the protrusions through the latching hole, while the bulge escapes the limiting hole when the protrusions engage the bracket at the periphery of the latching hole.

17. A guiding fixture for supporting a server in a server cabinet, the guiding fixture comprising:
- a latching member comprising a resisting plate and a pivot extending from the resisting plate, a plurality of protrusions extending outwards from an end of the pivot farthest away from the resisting plate;
- a supporting member comprising a main plate and a supporting arm extending outwards from a lateral side of the main plate, the main plate defining a circular hole through which the pivot is extendable and a plurality of slots extending radially and outwards from the circular hole through which the protrusions are extendable, respectively; and
- a resilient member, the resilient member comprising a main body and a supporting body extending from the main body, the supporting body overlapping the supporting arm, the main body and the resisting plate being located at opposite sides of the main plate, the main body defining a central hole corresponding to the circular hole and a plurality of slits around the central hole, the slits and the slots being alternating along a circumferential direction of the central hole;

wherein when the pivot is extended through the circular hole and the protrusions are extended through the slots, the latching member is rotatable such that a portion of the server cabinet is retained between the resisting plate and the protrusions; and the supporting arm is positioned where it can support a portion of the server.

* * * * *